Feb. 23, 1971 CHUNG C. LIU 3,566,296
TRANSISTOR DIFFERENTIAL AMPLIFIER
Filed Nov. 15, 1967 4 Sheets-Sheet 1

INVENTOR.
CHUNG C. LIU
BY *Fraser and Bogucki*
ATTORNEYS

Feb. 23, 1971 CHUNG C. LIU 3,566,296

TRANSISTOR DIFFERENTIAL AMPLIFIER

Filed Nov. 15, 1967

4 Sheets-Sheet 2

INVENTOR.
CHUNG C. LIU

BY Fraser and Bogucki

ATTORNEYS

Feb. 23, 1971 CHUNG C. LIU 3,566,296

TRANSISTOR DIFFERENTIAL AMPLIFIER

Filed Nov. 15, 1967

4 Sheets-Sheet 3

INVENTOR.
CHUNG C. LIU

BY Fraser and Bogucki

ATTORNEYS

INVENTOR.
CHUNG C. LIU
BY
Fraser and Bogucki
ATTORNEYS

United States Patent Office 3,566,296

Patented Feb. 23, 1971

3,566,296

TRANSISTOR DIFFERENTIAL AMPLIFIER

Chung C. Liu, San Jose, Calif., assignor to International Business Machines Corporation, Armonk, N.Y., a corporation of New York Filed Nov. 15, 1967, Ser. No. 683,259

Int. Cl. H03f 3/04, 3/68

U.S. Cl. 330—30 4 Claims

ABSTRACT OF THE DISCLOSURE

In a transistor differential amplifier pair, a bias voltage range is established for an associated current source. With the selected bias voltage, the current source compensates for temperature variations to maintain gain of the differenital amplifier pair substantially independent of normal temperature variations. A primary relation is established to define that bias voltage which causes the gain of any transistor differential amplifier pair having known characteristics to be insensitive to temperature change. More complex and series-coupled differential amplifier circuits may also be rendered temperature stable, with respect to gain, without the use of temperature compensating components.

BACKGROUND OF THE INVENTION

Field of the invention

This invention relates to differential amplifiers, and more particularly to means for rendering the gain of differential amplifiers stable with respect to operating temperature.

Description of the prior art

Differential amplifiers commonly use a pair of transistors having a direct coupling. Transistor parameters, such as current gain, base-emitter voltage and collector-base leakage current, have a high degree of temperature sensitivity, resulting in corresponding temperature sensitivity in the gain of the amplifier itself. Sensitivity of a differential amplifier to temperature is particularly troublesome in circuits in which such amplifiers are arranged in series, because the stability of the first stage is largely determinative of the overall characteristics of the circuit. Problems of temperature sensitivity have been overcome or confronted in the past by inserting resistors or resistor networks to compensate for temperature variations, as described in Buie, U.S. Pat. 2,867,695, and Pearlman et al., U.S. Pat. 3,329,836. These compensation techniques have relied on temperature sensitive resistance devices that have been required to encompass a substantial dynamic range. Not only are more components required by these techniques, but they generally do not provide suitably precise correction over the entire temperature range normally encountered.

SUMMARY OF THE INVENTION

The differential gain of a transistor pair is a function of several variables such as current gains, base-emitter voltages and collector-base leakage currents, each of which has a high degree of temperature sensitivity. In accordance with the invention, the bias voltage on a transistor current source supplying current to the transistor pair is maintained within a selected narrow range. It is shown that when circuits are arranged in this manner, a number of factors which determine gain are constants, and unaffected by temperature. The bias voltage only is variable, and the relationship is such that the temperature extremes normally encountered in systems using the circuits correspond only to small bias voltage changes.

Within this small bias voltage range, gain of the circuit is relatively constant because current variations from the source are so related to temperature as to compensate for the effects of temperature changes.

The basic equation for determining the bias voltage ($V_s$) needed for gain control of a simple differential amplifier pair is shown to be $V_s=(r-1)kT/q+V_{go}$, where:

$V_{go}$ is the apparent energy gap for the chosen semiconductor material,
$r$ is the transistor constant,
T is the temperature in degrees Kelvin,
$k$ is Boltzmann's constant, and
$q$ is the charge on an electron.

The concepts of the invention also encompass series-coupled sets of differential amplifiers, which may if desired be coupled to a constant current source, and to more complex differential amplifiers. The circuit relationships between bias voltage and temperature compensation also permit variation of the gain temperature coefficient of the circuit.

BRIEF DESCRIPTION OF THE DRAWINGS

The foregoing and other objects, features and advantages will be apparent from the following more particular description of preferred embodiments of the invention, as illustrated with the accompanying drawings.

DETAILED DESCRIPTION OF THE INVENTION

Figure 1:
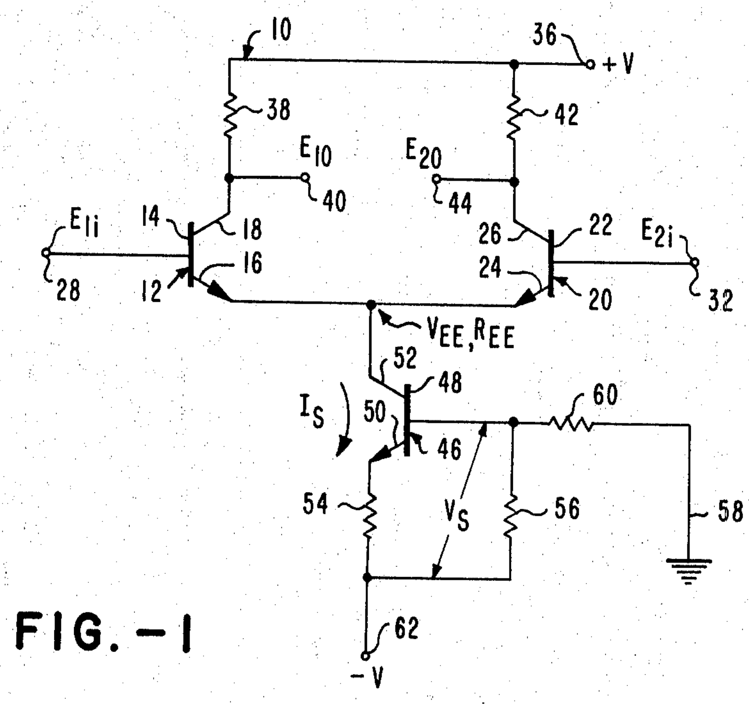
FIG. 1 is a schematic representation of a differential amplifier circuit in accordance with the invention.

A simple transistor differential amplifier pair as shown in FIG. 1, comprises a pair of transistors having common coupling (here between the emitters), a pair of differential inputs, a pair of differential outputs and a source of power.

As shown in FIG. 1, a simple differential amplifier 10 comprises a first transistor 12 having base 14, emitter 16 and collector 18 and a second transistor 20 having base 22, emitter 24 and collector 26. Input voltage, $E_{11}$, applied to input terminal 28 feeds the base of the first transistor 12. Input voltage, $E_{21}$, comprising the other half of the differential input signal, applied to terminal 32 feeds the base 22 of the second transistor 20. The collector 18 of the first transistor 12 is connected through a collector resistor 38 to a positive voltage source connected to a voltage source 36. The collector 18 of the first transistor 12 provides an output signal, $E_{10}$, at a connected output terminal 40. The collector 26 of the second transistor 20 is connected through a collector resistor 42 to the voltage source 36, and provides a second output signal, $E_{20}$, at output terminal 44.

A third transistor 46, having a base 48, emitter 50 and collector 52, provides a current source for the differential amplifier pair of transsistors 12, 20. The emitters 16, 24 of the transistors 12, 20 are connected together. The current source transistor 46 conducts, supplying current to the common emitters 16, 24 of the transistors 12, 20. The base 48 of the current source transistor 46 is coupled through a resistor 60 to a point of reference potential, here a grounded connection. The emitter 50 of current source transistor 46 is connected to a negative voltage source 62 across an emitter resistor 54. The bias voltage $V_s$ on the current source transistor 46 is, in more general terms, the potential difference between voltage source 62 and the base 48 of the transistor 46 which is more positive than voltage source 62.

In the operation of the circuit of FIG. 1, the ground at terminal 58 holds the base 48 of current source transistor 46 slightly more positive than the emitter 50 of current source transistor 46 so that current source transistor 46 conducts at a relatively low level. While both base 48 and voltage source 62 are negative in relation to ground, the bias voltage, $V_s$, is relatively positive since the base 48 of transistor 46 is more positive than voltage source 62. A current is conducted from voltage source 62 across emitter resistor 54. The same current is conducted across collector 52 of transistor 46. Exactly half of the current is conducted across each emitter 16, 24 of transistors 12 and 20, respectively, assuming the differential amplifier pair is balanced. The first input signal in the differential input pair appears as a voltage source, $E_{1i}$, and is connected to terminal 28 to base 14 of the first transistor 12, controlling the conductivity of the first transistor 12. The second differential input, comprising voltage source $E_{2i}$, is connected to terminal 32 to base 22 of the second transistor 20, controlling the conductivity of the second transistor 20. The collector resistors 38, 42 are selected to be the same, and the first and second transistors 12, 20 themselves are chosen to have like characteristics. If the differential input signals, $E_{1i}$ and $E_{2i}$, are of equal amplitude, equal currents pass through the first transistor 12 and its associated circuitry and second transistor 20 and its associated circuitry. If, however, $E_{1i}$ is more positive than $E_{2i}$, the first transistor 12 conducts more negative current from collector 52 of transistor 46 than second transistor 20 (both transistors being NPN in this particular example) causing output terminal 40 to go more negative than terminal 44, in an amount corresponding to the differential gain applied to the difference between $E_{1i}$ and $E_{2i}$. Conversely, if terminal 32 is more positive than terminal 28, second transistor 20 conducts more than first transistor 12 and terminal 44 becomes more negative than terminal 40. Thus, a pair of differentially amplified output signals are derived as signals $E_{10}$ and $E_{20}$ at the output terminals 40 and 44 respectively.

Unfortunately, the characteristics of transistors change as a function of temperature and most differential amplifiers are used in environments subject to temperature change. According to the present invention, the gain of the differential amplifier is defined by the bias voltage on the base 48 of the current source transistor 46, which bias is maintained within a limited range for a given circuit configuration. The factors, which affect gain of a differential transistor pair as temperature changes, are isolated, and it is shown that the derivative of gain with respect to temperature can be set equal to zero with a predetermined bias voltage. Thus, only the bias voltage on the current source transistor 46 need be changed with temperature, and further only very small changes are involved.

The differential gain of the transistor pair can be reduced to the simple form:

$$A_v=\frac{E_{20}-E_{10}}{E_{1i}-E_{2i}}=\frac{R_L}{r_e} \qquad (1)$$

as follows:

For the differential amplifier pair, FIG. 1, the output function is given by:

$$E_{20}-E_{10}=\frac{(\alpha 1^{R}L1+\alpha 2^{R}L2)}{\Delta}\Bigg[(E_{1i}-E_{2i})+V_{BE2}-V_{BE1})+(R_{b1}I_{co1}-R_{b2}I_{co2})+\frac{VEE}{REE}\left(\frac{R_{b1}}{\beta 1}-\frac{R_{b2}}{\beta 2}+R_{e1}-R_{e2}\right)\Bigg]+(I_{co1}R_{L1}-I_{co2}R_{L2}) \qquad (2)$$

where $$\Delta=R_{e1}+R_{e2}+\frac{R_{b1}}{\beta 1}+\frac{R_{b2}}{\beta 2}+\frac{R_{b1}R_{b2}}{\beta 1\beta 2^{R}EE} \qquad (3)$$

and where it is assumed that $\alpha$ is constant, $R_L \ll r_c$, and the device extrinsic resistances are included in $R_{e1}$, $R_{e2}$, $R_{b1}$ and $R_{b2}$.

The first term in Equation 2 is the desired output for a given input and it represents the voltage gain of the differential pair. The second term is the output due to differences in $V_{BE}$. The third and fifth terms are due to differences in $I_{co1}$, and $I_{co2}$, and the fourth term is an output due to differences in $\beta_1$ and $\beta_2$.

The first term in Equation 2 can be expressed in the following form:

$$A_v=\frac{E_{20}-E_{10}}{E_{1i}-E_{2i}}=\frac{\alpha 1^{R}L1+\alpha 2^{R}L2}{\Delta} \qquad (4)$$

Assume the following:

(1) $R_{L1}=R_{L2}=R_L$ (2) $\alpha_1=\alpha_2=1$ (3) $R_{e1}$ and $R_{e2}$ contain only extrinsic emitter resistances of the transistor pair, $R_{e1}=R_{e2}=r_e$ (4)
$$R_{e1}+R_{e2}\gg\frac{R_{b1}}{\beta 1}+\frac{R_{b2}}{\beta 2}+\frac{R_{b1}R_{b2}}{\beta 1\beta 2^{R}EE}$$

then $\Delta=R_{e1}+R_{e2}=2r_e$

Assumptions (1) and (3) are fulfilled by circuit configuration. Assumptions (2) and (4) can also be realized by using devices of latest transistor technology. These are all valid and practical assumptions. With these assumptions Equation 4 is reduced to $$A_v=\frac{E_{20}-E_{10}}{E_{1i}-E_{2i}}=\frac{R_L}{r_e} \qquad (1)$$

where $r_e$=extrinsic emitter resistance of the transistor.

With a given temperature and emitter current, the transistor extrinsic emitter resistance is well defined and is given by the equation:

$$r_e=\frac{kT}{qI_e} \qquad (5)$$

where $k$=Boltzmann's constant=$1.380\times10^{-23}$ joule/°K.

T=Absolute temperature, °K.

$q$=Electronic charge=$1.602\times10^{-19}$ coulomb $I_e$=Emitter current $kT/q$=0.026 volt at 300° K.

Substituting (5) into (1) yields:

$$A_v=\frac{qR_L}{kT}I_e=\frac{qR_L}{2kT}I_s \qquad (6)$$

where $I_s=2I_e$=current source current supplied by current source transistor 46.

If gain is to be insensitive to temperature, $dA_v/dT$ must be 0.

Differentiating (6) with respect to T, it is found that:

$$\frac{dA_v}{dT}=\frac{qR_L}{2kT}\left[\frac{\partial I_s}{\partial T}-\frac{I_s}{T}\right] \qquad (7)$$

Note that when $$\frac{\partial I_s}{\partial T}=\frac{I_s}{T}$$

(the rate of change of current flow from collector 52 to emitter 50 of transistor 46 with respect to change in absolute temperature equals the ratio of current flow from collector 52 to emitter 50 of transistor 46 to absolute temperature), the gain of the differential amplifier is maintained substantially independent of normal temperature variations.

The emitter current for a transistor operating in the amplification region with moderate values of current can be expressed independent of transistor current gain as:

$$I_e \approx I_c = I_s = aT^r \exp\,(\phi_{BE} - V_{go})\frac{q}{kT} \quad (8)$$

where $a$ and $r$ are transistor constants and $V_{go}$ is the apparent energy gap for the semiconductor material at $T=0°$ K. These constants are independent of T.

If the current gain of the current source transistor 46 is large enough, then the collector source current is given by:

$$I_s = \frac{V_s - \phi_{BE}}{R_2} \quad (9)$$

$$\phi_{BE} = V_s - I_s R_2 \quad (10)$$

where $\phi_{BE}$=base-emitter voltage of current source transistor 46.

Substituting (10) into (8) yields:

$$I_s = aT^r \exp\left[(V_s - I_s R_2 - V_{go})\frac{q}{kT}\right] \quad (11)$$

In order to calculate the small change in $I_s$ produced by small change in T, Equation 11 is differentiated with respect to T, yielding:

$$\frac{\partial I_s}{\partial T} = \frac{qR_L I_s}{T}\left[\frac{rkT/q - V_s + I_s R_2 + V_{go}}{kT/q + I_s R_2}\right] \quad (12)$$

Substituting (12) into (7) yields:

$$\frac{\partial A_v}{\partial T} = \frac{qR_L I_s}{2kT^2}\left[\frac{(r-1)kT/q - V_s + V_{go}}{kT/q + I_s R_2}\right] = 0 \quad (13)$$

where the gain of the differential amplifier is independent of temperature variations. From which it follows that:

$$V_s = (r-1)kT/q + V_{go} \quad (14)$$

The conclusion follows from (14) that there exists a bias voltage, $V_s$, which gives the amplifier gain which is free from changes caused by temperature change. This voltage is predominantly dependent on the physical constants of the semiconductor material.

In FIG. 1, NPN transistors are shown. The apparent energy gap for silicon is 1.205 volts. A typical value for NPN silicon transistors is $r=1.5$, $kT/q=25.8$ mv. at room temperature, 25° C. $V_s$ can therefore be calculated as follows:

$$V_s = 0.5 \times 25.8 \times 10^{-3} + 1.205 = 1.22 \text{ volts}$$

(for typical NPN transistors in a simple differential amplifier at room temperature, 25° C.) In practice, satisfactory results are obtained if bias voltage $V_s$ is in a selected range around the calculated theoretical value. This calculation shows that the selected range is determined primarily by the energy gap constant, $V_{go}$, for the transistor and secondarily in accordance with absolute temperature. Since the constant term $V_{go}$ is primarily determinative of the bias voltage value for the transistor current source, the bias voltage for constant gain silicon NPN transistors must be slightly greater than 1.2 volts.

In a similar manner, $V_s$ can be calculated for PNP transistors. The apparent energy gap for silicon is 1.205 volts. The constant $r$ would vary from about 2.3 to 3.3 for PNP silicon transistors. Rough calculations of $V_s$ using $r=2.8$, then yields:

$$V_s = 1.8 \times 25.8 \times 10^{-3} + 1.205 = 1.25 \text{ volts}$$

(for typical PNP transistors in a simple differential amplifier at room temperature, 25° C.)

It therefore will be clear to those skilled in the art that the arrangement of FIG. 1 uses a transistor current source in conjunction with a transistor differential amplifier pair to provide a novel form of temperature independent circuit. The transistor current source, partially conducting to provide a moderate controlled current, is operated with a bias voltage such that change in temperature causes a minimum change in gain of the differential amplifier pair and can be compensated by the bias voltage.

The circuit as shown in FIG. 1 can be operated with $V_s$ according to the equation: $V_s=(r-1)kT/q+V_{go}$, keeping the gain of the differential amplifier pair constant as temperature changes. In many applications, the operating temperature range is only a few degrees or the gain of the differential amplifier may need only to be held substantially constant as temperature changes. For applications such as these, a $V_s$ can be chosen according to the above equation for a T at a preselected point within the expected operating temperature range. This constant $V_s$ can be used with consequent reduction in circuitry and no essential loss of performance.

Figure 2:
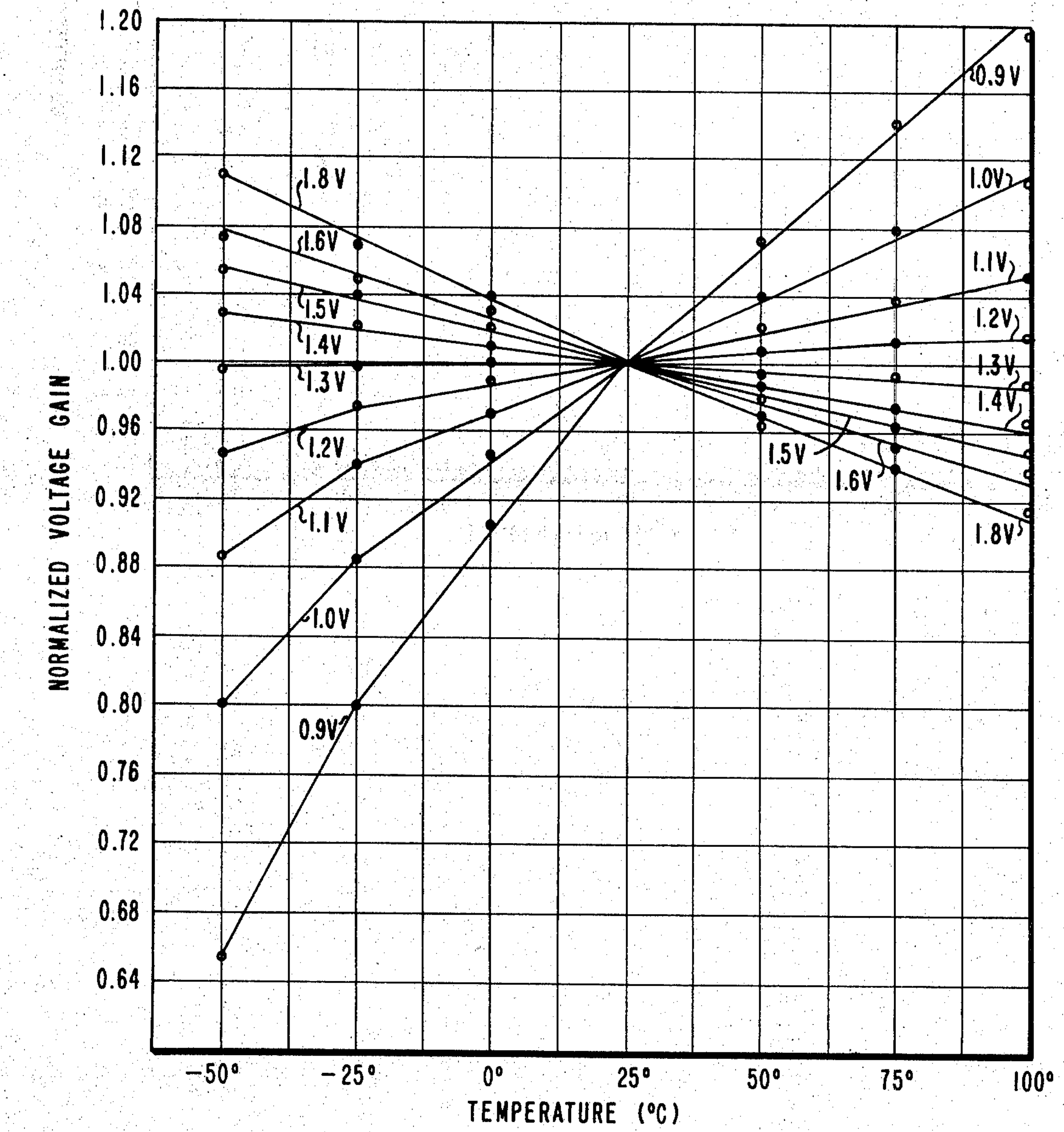
FIG. 2 is a graph of experimental data showing gain variations with temperature for various bias voltages useful in explaining the circuit of FIG. 1.

FIG. 2 shows a graph of experimental data derived from a simple differential pair such as that shown in FIG. 1. The ordinate represents gain, the abscissa represents temperature in degrees centigrade, and a family of curves of gain vs. temperature are generated for various bias voltages $V_s$. The gain of the differential amplifier at 25° C. is established as one for all bias voltages. Gains are then plotted for temperatures for minus 50° C. to plus 100° C. encompassing nearly the total operating temperature range of differential amplifiers in typical process control and instrumentation applications.

The basic equation, $V_s=(r-1)kT/q+V_{go}$, indicates that gain of a differential amplifier should be substantially independent of temperature change when bias voltage is between approximately 1.2 and 1.3 volts for both NPN and PNP transistors. FIG. 2 shows that the closer bias voltage approaches the 1.2 to 1.3 volts range, the smaller are the changes in gain with temperature.

Figure 3:
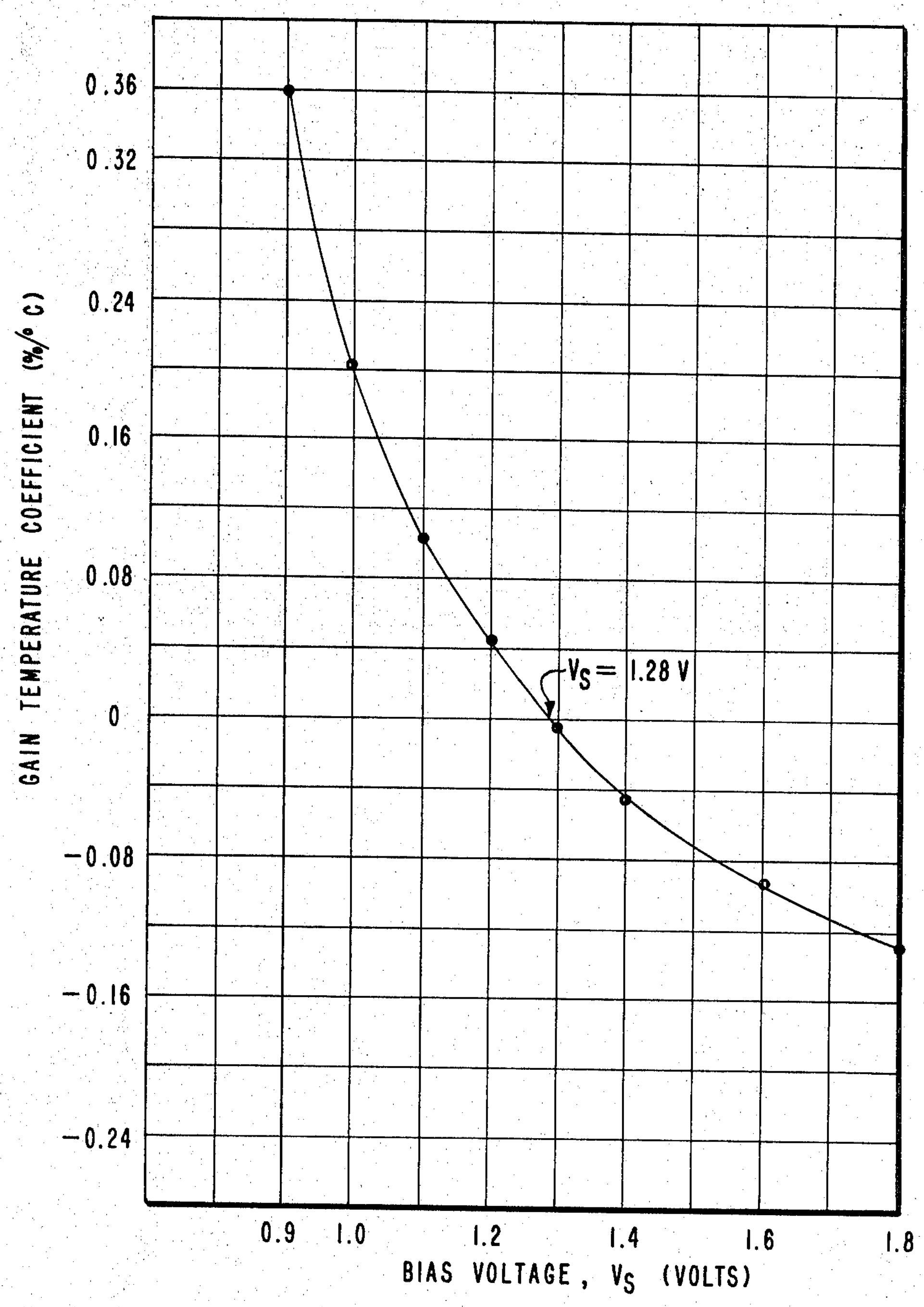
FIG. 3 is a graph of temperature gain coefficient variations with bias voltage, useful in explaining further aspects of the invention.

FIG. 3 is a graph with ordinate representing gain temperature coefficient (percentage/degrees centigrade) plotted against bias voltage, $V_s$ (in volts) as the abscissa. The ideal differential amplifier, having no change in gain with temperature changes, has a zero gain temperature coefficient. The experimental data plotted in FIG. 3 shows that the closer bias voltage $V_s$ comes to the 1.2–1.3 volts range, the closer the gain temperature coefficient comes to the ideal value of zero. As explained previously, the exact bias voltage required to give a differential amplifier zero change in gain with respect to change in temperature depends on various transistor constants.

Figure 4:
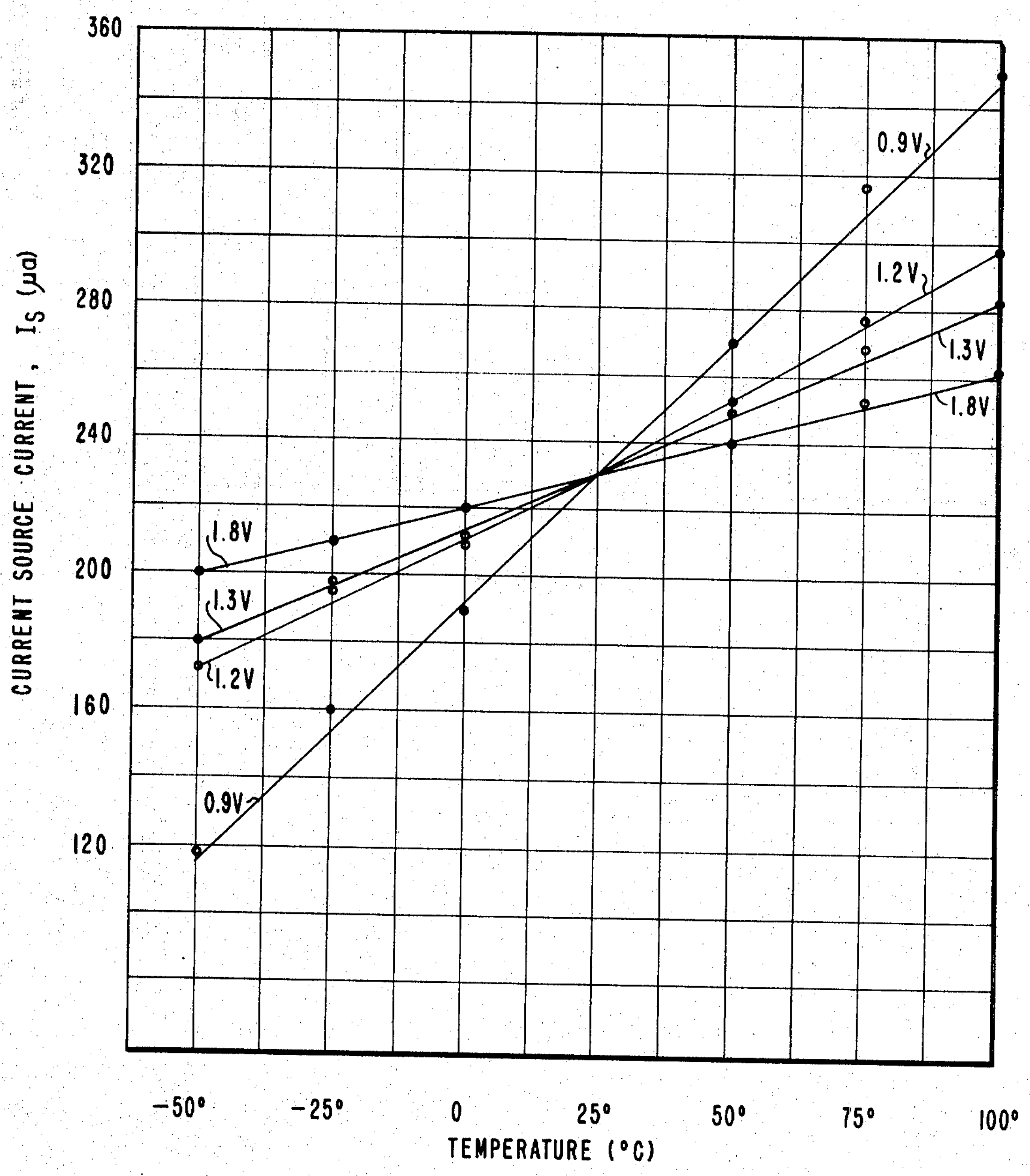
FIG. 4 is a graph of current variations with temperature for different bias voltages in the arrangement of FIG. 1.

FIG. 4 is a graphical representation of the amplitude of current source current, $I_s$ (in microamps) as ordinate plotted against temperature (in degrees centigrade). At any given temperature, current source transistor 46 conducts a constant current $I_s$ to the differential amplifier. When temperature changes, however, the operative characteristics of the current source transistor 46 also change, even though bias voltage $V_s$ remains constant. Current source transistor 46, therefore, has the same voltage on its base 48 and emitter 50 as previously at the different temperature, but conducts differently because of the change in temperature.

The change conduction of the current source also changes the operative characteristics of the differential amplifier to which current source current $I_s$ is fed. As shown in FIG. 4 the slope of current source current $I_s$ is greatest when bias voltage $V_s$ equals 0.9 volt. This slope, however, is too great and causes the gain of the differential amplifier fed by current source current $I_s$ to increase as temperature increases as is shown on FIG. 2. Therefore the circuit has a positive gain temperature coefficient at this bias voltage. In opposite manner, when bias voltage $V_s$ equals 1.8 volts, the slope is not great enough, and the gain of the differential amplifier decreases as temperature increases, to provide a negative gain temperature coefficient. FIG. 4 shows that when bias voltage is in the range of 1.2–1.3 volts, the current source current $I_s$ increases with increase in temperature at a rate intermediate between the rates for bias voltage equal to 0.9 volt and 1.8 volts. This increase in current source current $I_s$ is approximately sufficient to balance other changes in gain of the differential pair caused by change in temperature. Referring back to Equation 7, it may be seen that the differential $\partial I_s/\partial T$ equals $I_s/T$, rendering the difference equal to 0, and ensuring that as temperature changes, current source current changes at the rate necessary to maintain constant differential amplifier gain. In practice, it is sufficient if the partial derivative of current with respect to temperature has approximately the same ratio as current with respect to temperature. The exact bias voltage $V_s$ for a particular differential amplifier depends, of course, on the particular constants for the transistors used in the particular differential amplifiers.

Figure 5:
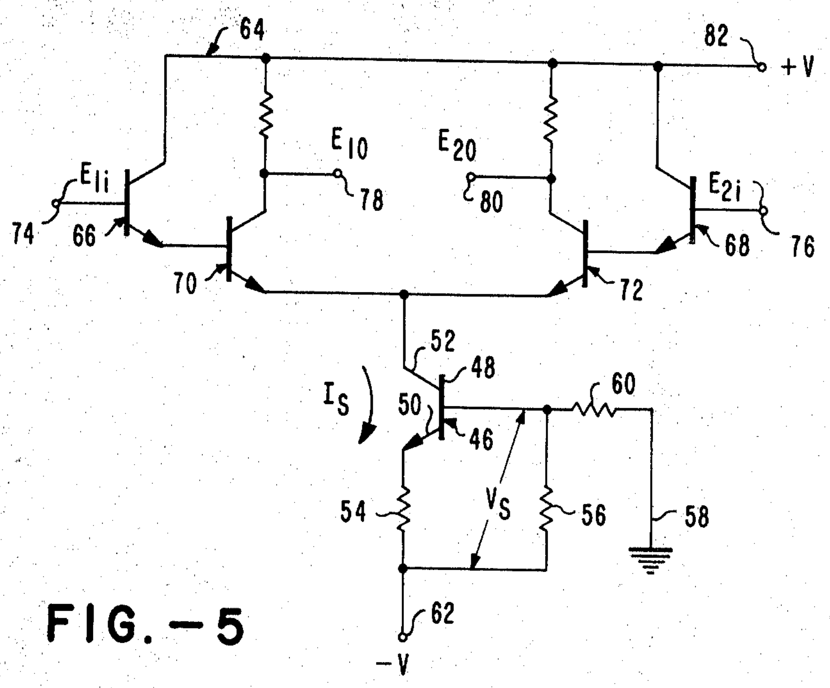
FIG. 5 is a schematic circuit diagram of a different arrangement in accordance with the invention.

FIG. 5 is a schematic of a circuit wherein a current source transistor 46 as previously described with reference to FIG. 1 feeds a current source current $I_s$ to a more complex differential amplifier 64. This amplifier 64 comprises, in each half, a cascaded pair of transistor amplifier stages. More amplifier stages may be used, of course, if greater gain is desired.

In one half, the differential amplifier $E_{1i}$ at terminal 74 is amplified by transistor 66 and controls transistor 70. In like manner, in the other half, input $E_{2i}$ at terminal 76 is amplified by transistor 68 and controls transistor 72. Transistor 70 controls $E_{10}$ at terminal 78 and transistor 72 controls $E_{20}$ at terminal 80. Power for $E_{10}$ and $E_{20}$ is supplied by +V at terminal 82 and current source current $I_s$.

This more complex differential amplifier differs from the simple differential pair discussed previously in FIG. 1 in that gain is greater with no reduction in stability. There are more transistors in this differential amplifier 64 than in the previously discussed differential pair 10, so there are more parameters which are affected by change in temperature. In theory, therefore, the basic equation for determining a bias voltage such that gain of the differential amplifier is independent of temperature change, $V_s=(r-1)kT/q+V_{go}$, should be different. In practice, however, the difference is so small that the same basic equation used for simple differential pairs can be used for more complex differential amplifiers such as shown in FIG. 5.

While the invention has been particularly shown and described with reference to preferred embodiments thereof, it will be understood by those skilled in the art that various changes in form and details may be made therein without departing from the spirit and scope of the invention.

What is claimed is:

1. A differential amplifier comprising:

a transistor pair, each transistor having emitter, base and collector terminals, the emitters of the transistors being coupled together, the bases of the transistors being coupled to receive the differential input signals and the collectors of the transistors being coupled to provide the differential output signals;

a transistor current source connected at a junction point between said emitters of said transistor pair;

a bias voltage source, said bias voltage, $V_s$, being quantitatively established by the following relationship:

$$V_s=(r-1)kT/g+V_{go}$$

where:

$r$=A constant for the particular semiconductor of the transistor current source $k$=Boltzmann's constant $T$=Absolute temperature in ° Kelvin $q$=The charge on an electron $V_{go}$=The energy gap for the particular semiconductor of the transistor current source; and, means for connecting said bias voltage source to said current source so that the current at a given temperature is a function of the bias voltage.

2. The invention as set forth in claim 1 above, wherein said bias voltage is maintained in the range of approximately 1.2 to 1.3 volts.

3. A differential amplifier comprising:

a first NPN transistor having emitter, base and collector terminals;

a second NPN transistor having emitter, base and collector terminals, the emitter of said first and second transistors being coupled together, the bases of said first and second transistors being coupled to receive the differential input signals and the collectors of said first and second transistors being coupled to provide the differential output signals;

a current source including a third NPN transistor having emitter, base and collector terminals, said third NPN transistor being arranged to be moderately conducting;

means for connecting said current source to the emitters of said first and second transistors;

a bias voltage source generating a bias voltage for said current source, said bias voltage, $V_s$, being quantitatively established by the following relationship:

$$V_s=(r-1)kT/g+V_{go}$$

where:

$r$=A constant for the semiconductor of the third transistor $k$=Boltzmann's constant $q$=The charge on an electron $V_{go}$=The energy gap for the semiconductor of the third transistor, wherein said bias voltage $V_s$ is maintained at approximately 1.22 volts; and means for connecting said bias voltage source to said third transistor.

4. A differential amplifier comprising:

a pair of transistor differential amplifier halves, each comprising at least two transistors coupled in cascade fashion, said halves being coupled together;

a transistor current source;

means connecting said current source to the coupling of said transistor differential amplifier halves;

a bias voltage source coupled across said transistor current source, said bias voltage, $V_s$, being quantitatively established by the following relationship:

$$V_s=(r-1)kT/g+V_{go}$$

where:

$r$=A constant for the semiconductor of the transistor current source $k$=Boltzmann's constant $T$=Absolute temperature in ° Kelvin of the predetermined average of the operating temperature range of said differential amplifier $q$=The charge on an electron $V_{go}$=The energy gap for a particular semiconductor, such that the constant term $V_{go}$ is primarily determinative of the bias voltage value for the transistor current source.

References Cited

UNITED STATES PATENTS

| | | | |
|---|---|---|---|
| 3,262,066 | 7/1966 | Trilling | 330—69 |
| 3,310,688 | 3/1967 | Ditkofsky | 330—69X |
| 3,395,358 | 7/1968 | Petersen | 330—69X |

NATHAN KAUFMAN, Primary Examiner

U.S. Cl. X.R.

330—69

PO-1050
(5/69)

UNITED STATES PATENT OFFICE
CERTIFICATE OF CORRECTION

Patent No. 3,566,296 Dated February 23, 1971

Inventor(s) Chung C. Liu

It is certified that error appears in the above-identified patent and that said Letters Patent are hereby corrected as shown below:

Column 7, line 63, should read --$V_s=(r-1)kT/q+V_{go}$--.

Column 8, line 11, "emitter" should read --emitters--; after line 31 and before line 32, insert --T = Absolute temperature in ° Kelvin--; line 48 should read --$V_s=(r-1)kT/q+V_{go}$--.

Signed and sealed this 29th day of June 1971.

(SEAL)
Attest:

EDWARD M.FLETCHER,JR.
Attesting Officer

WILLIAM E. SCHUYLER, JR.
Commissioner of Patents